United States Patent [19]

Gatti et al.

[11] Patent Number: 4,620,756

[45] Date of Patent: Nov. 4, 1986

[54] PRINTED WIRING ASSEMBLY INSERTION/EXTRACTION TOOL

[75] Inventors: John E. Gatti, Scottsdale; Tammy C. Martin, Chandler, both of Ariz.; Jack P. Hall, Palo Alto; Peter M. Fogg, Burlingame, both of Calif.

[73] Assignee: Motorola Computer Systems, Inc., Cupertino, Calif.

[21] Appl. No.: 808,713

[22] Filed: Dec. 13, 1985

[51] Int. Cl.$^4$ .......................................... H01R 13/629
[52] U.S. Cl. ..................... 339/17 M; 29/758; 29/764; 339/45 M; 339/75 MP
[58] Field of Search ............ 339/45 M, 17 LM, 17 M, 339/75 M, 75 MP; 29/758, 764

[56] References Cited

U.S. PATENT DOCUMENTS

| | | | |
|---|---|---|---|
| T876,004 | 7/1970 | Andreini et al. | 339/45 M |
| 2,976,510 | 3/1961 | Blain | 339/17 LM |
| 3,476,258 | 11/1969 | Dorsett | 339/17 M |
| 4,109,379 | 8/1978 | Ratti et al. | 29/758 |
| 4,134,631 | 1/1979 | Conrad et al. | 339/17 M |
| 4,223,934 | 9/1980 | Caugeglia et al. | 29/764 |

*Primary Examiner*—John McQuade
*Attorney, Agent, or Firm*—Walter W. Nielsen

[57] ABSTRACT

A printed wiring assembly card insertion/extraction tool is provided of circular cross-section with a cam-like member at one end. Each card within the card cage has a tab centrally located along one edge, the tab containing a keyhole-like aperture. When the cards are in their normal side-by-side position within the card cage, all of the apertures line up with a similarly shaped aperture in a support bracket mounted on one side of the card cage, such that the insertion/extraction tool may be inserted through the apertures. A selected card may be extracted by appropriate rotation of the tool about its axis, whereby the cam-like member engages the corresponding aperture of the selected card and forces it out. Likewise, cards may be inserted by reversal of the process. A retaining bracket is provided on the opposite side of the card cage opening from the support bracket.

8 Claims, 3 Drawing Figures

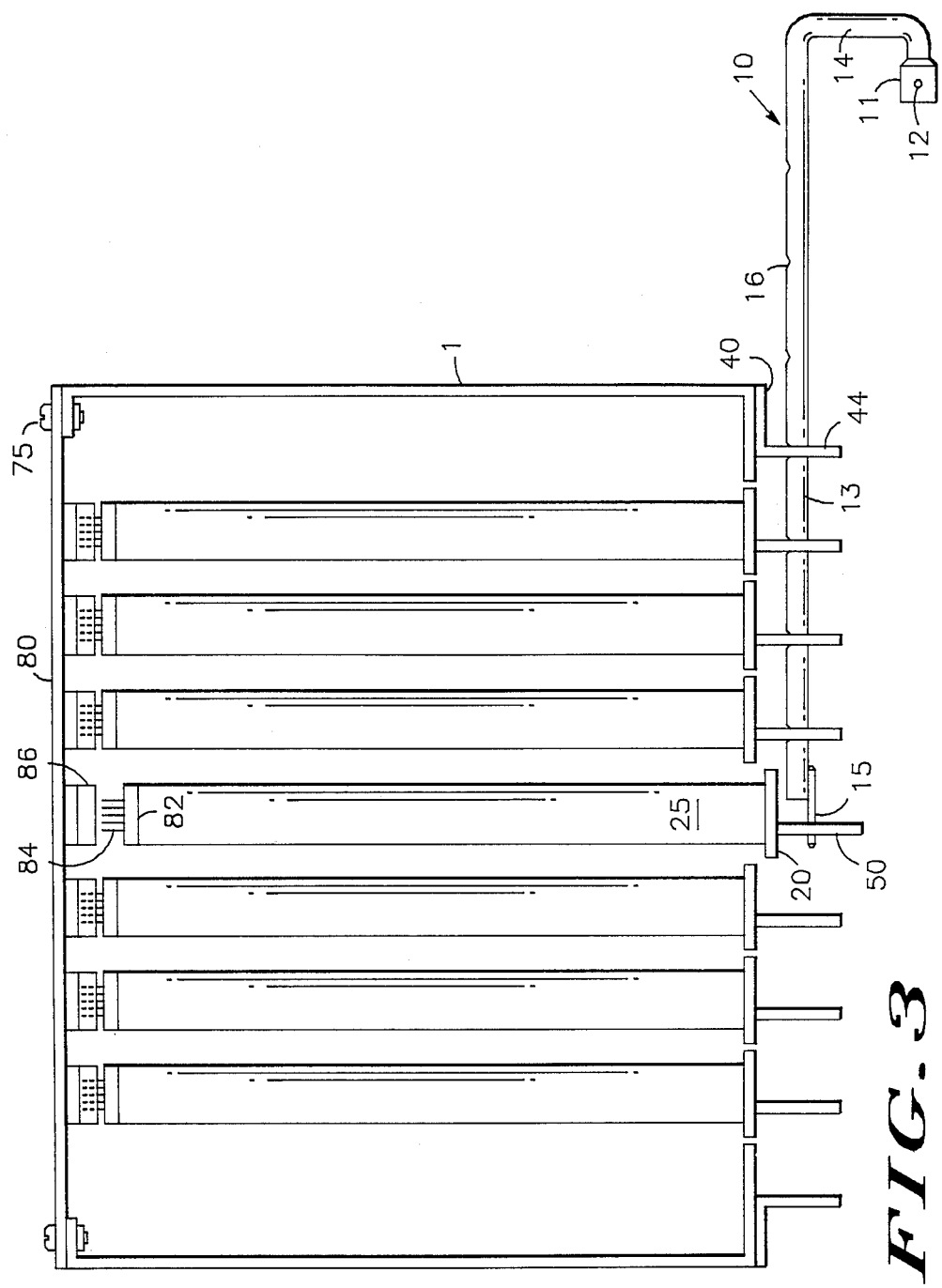

PRINTED WIRING ASSEMBLY INSERTION/EXTRACTION TOOL

TECHNICAL FIELD

This invention relates in general to printed wiring assemblies and, in particular, to a printed wiring assembly insertion/extraction tool.

BACKGROUND OF THE INVENTION

It is well known in the electronic arts to position and interconnect electronic components on printed wiring boards or printed wiring assemblies (PWA's). In large electronic systems, comprising several PWA's, it is also well known to electrically interconnect the PWA's through a back-plane or "motherboard".

A common technique for coupling multiple PWA's to a back-plane is to provide one or more connectors along one edge of each PWA, with appropriate pins of each connector being electrically connected to appropriate wiring runs on the PWA, and to provide an appropriate mating connector on the back-plane. Each PWA is thus physically secured and electrically coupled to the back-plane by pressing the PWA connector into the back-plane connector.

In complex systems, such as digital computers, it is common for each PWA to have multiple back-plane connectors. Each such connector may comprise many pins. The physical force required to insert and extract a PWA from the back-panel connectors becomes quite significant, due to the frictional forces between the pins of one connector and the sockets of the other connector. For example, for a PWA having three 96-pin connectors, a force of approximately 40-60 pounds is required to insert the PWA into the back-plane and only slightly less force is required to extract the PWA from the back-plane.

Due to the large forces required to extract PWA's from their associated back-planes, it is quite difficult for an assembly person or repair person to grasp the PWA with sufficient force to extract it. Often there may be no convenient means on the PWA to grasp. Indeed, various U.S. and foreign electrical underwriting associations are at the present time requiring that, due to the potential danger of electrical shock to a user, there be no convenient knobs, pulls, etc. situated on the exterior surface of the PWA to facilitate extraction by hand, and such associations require that PWA's be designed so that some form of tool must be used to extract them from the unit.

Also in the typical office environment there is often rather limited access to the data processing equipment, so it is quite advantageous to be able to extract the PWA from the back-plane with one hand.

There is therefore an urgent need in the electronic arts for a convenient tool to insert and extract large PWA's from their associated back-planes.

BRIEF SUMMARY OF INVENTION

Accordingly, it is an object of the present invention to provide an improved means for inserting and extracting printed wiring assemblies into and from their associated back-planes.

It is also an object of the present invention to provide an improved printed wiring assembly insertion and extraction tool.

These and other objects are achieved in accordance with a preferred embodiment of the invention by providing a printed wiring assembly card cage comprising a printed wiring assembly card cage comprising a housing having at least one surface with an aperture therein; a plurality of printed wiring assembly cards, the cards being adapted to fit into the housing aperture in a side-by-side arrangement, each of the cards having affixed to one edge thereof a tab centrally located between the ends thereof, each tab containing an asymmetrically-shaped aperture therein; a support member positioned substantially at a right angle to the housing surface, the support member containing an aperture substantially identical to those of the tabs, the plurality of cards having the tab apertures aligned with the support member aperture when the plurality of cards are fully inserted in the housing; and an insertion/extraction member having an end portion thereof of asymmetrically-shaped cross-section corresponding to the tab apertures; whereby by selection of a suitable position of rotation of the insertion/extraction member about its axis, the insertion/extraction member may be inserted through the support member aperture and through at least one of the tab apertures, and then by rotating the insertion/extraction member in the appropriate direction about its axis the end portion thereof may be suitably engaged with the tab aperture of a selected one of the cards to insert the card into the housing or to extract the card from the housing.

BRIEF DESCRIPTION OF THE DRAWINGS

The invention is pointed out with particularity in the appended claims. However, other features of the invention will become more apparent and the invention will be best understood by referring to the following detailed description in conjunction with the accompanying drawings in which:

FIG. 3 shows a top sectional view of the printed wiring assembly card cage taken along line 3—3 of FIG. 1, and the insertion/extraction tool.

DETAILED DESCRIPTION OF THE INVENTION

Figure 1:
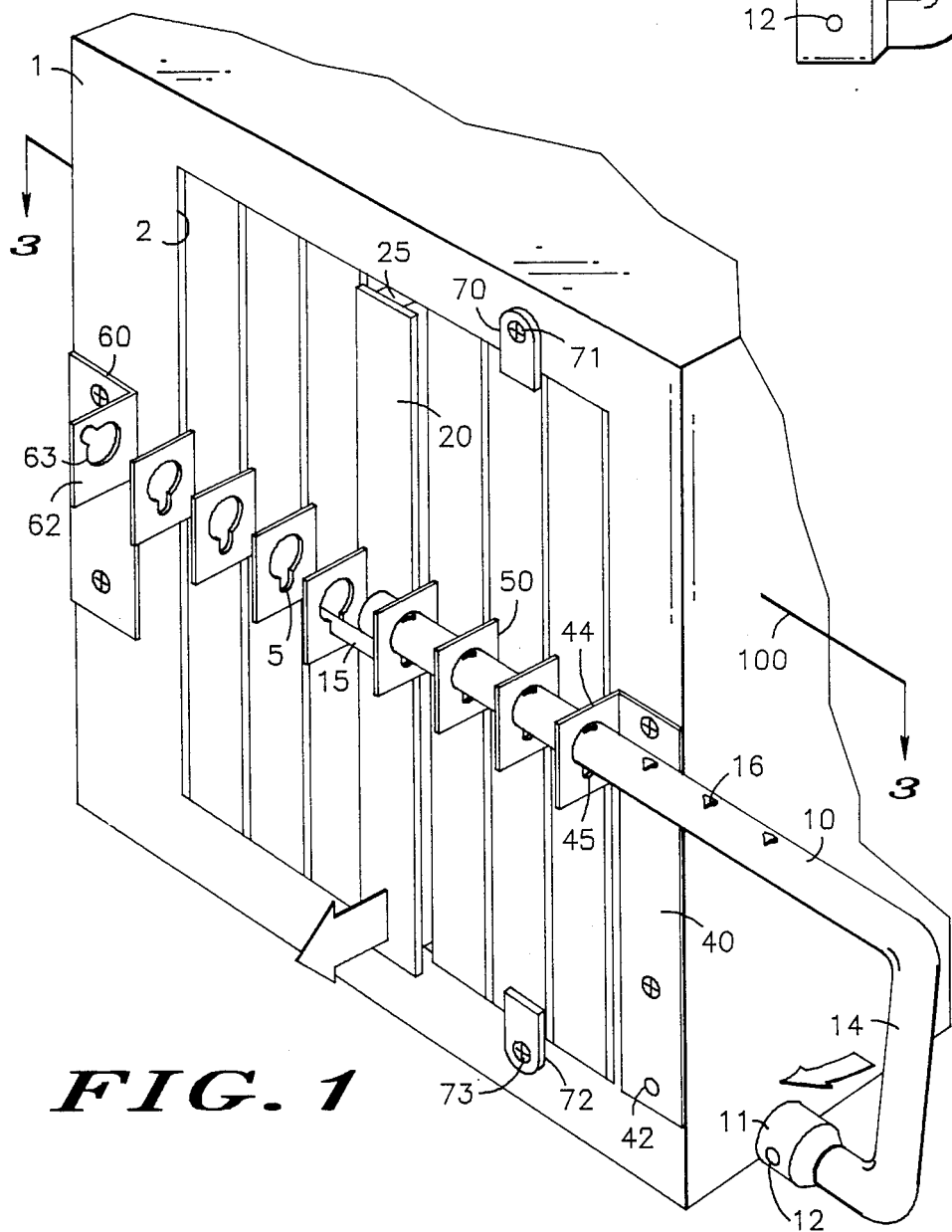
FIG. 1 shows a perspective illustration of a portion of a printed wiring assembly card cage as viewed from the right-front thereof, showing a preferred embodiment of a printed wiring assembly insertion and extraction tool as used to extract a printed wiring assembly from the card cage.

Referring now to FIG. 1, a right-front perspective view of a portion of printed wiring assembly (PWA) card cage 1, including the PWA insertion/extraction tool 10, is shown. Card cage housing 1 has an aperture 2 in one surface therein of appropriate size to permit one or more PWA's, such as PWA 25, to be inserted into card cage 1. Each PWA 25 has affixed to one edge thereof a PWA fascia 20 which is customarily formed of a relatively rigid material in order to provide mechanical longitudinal rigidity, especially when the PWA is being extracted from card cage 1.

Each PWA fascia 20 has affixed thereto a tab 50, which is centrally positioned approximately halfway between each end of fascia 20. Each PWA tab 50 is suitably affixed to its corresponding fascia 20, for example, by welding.

Each PWA tab 50 has an asymmetrical aperture 5 therein. Aperture 5, in a preferred embodiment of the invention, is a keyhole-shaped aperture formed of a first circular opening having a first diameter and a second circular opening having a second diameter. The second circular opening is offset from the first circular opening, such that an asymmetrical aperture results.

In the preferred embodiment of the invention, the tab apertures 5 are oriented such that the second circular opening is positioned towards the bottom of the tab 50—i.e., the centers of the first and second circular openings are on a line which is parallel to the edge of PWA fascia 20. When all of the PWA's are fully inserted into the card cage 1, so that the fascia 20 of each PWA 25 is flush with the adjoining PWA fascia 20, the aperture 5 of each WA 1 will be aligned.

The PWA's may be secured to the housing 1 when they are in the fully inserted position by suitable means such as, for example, tabs 70 and 72 on the ends of fascia 20. Tabs 70 and 72 may be secured to the outer surface of card cage 1 by means of screws 71 and 73, respectively.

A support bracket 40 is affixed at one side of the card cage aperture 2, such bracket having a member 44 positioned substantially at a right angle thereto. The member 44 has therein an asymmetrical aperture 45 of substantially the same shape and size as the apertures 5 of tabs 50. When the PWA's are fully inserted into card cage 1, apertures 5 are aligned with aperture 45.

A retaining bracket 60 having a member 62 positioned substantially at a right angle thereto is located on the opposite side of the card cage aperture 2. Member 62 has an asymmetrically shaped aperture 63 located therein. Aperture 63 has a different angular orientation than apertures 5 and 45.

Figure 2:
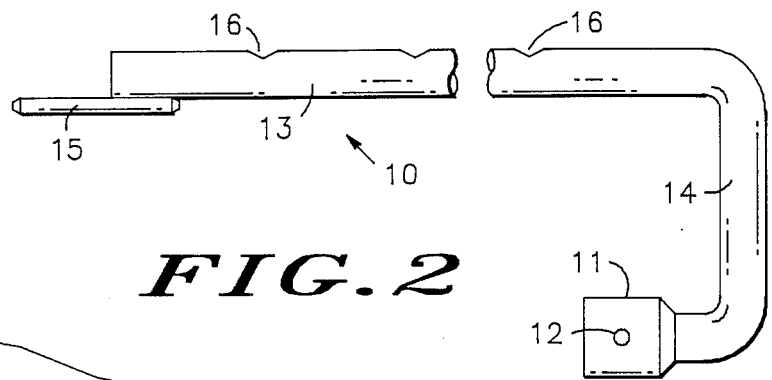
FIG. 2 shows a front view of the printed wiring assembly insertion and extraction tool of the present invention.

Referring now to FIG. 2, a front view of the PWA insertion/extraction tool 10 is shown. Tool 10 comprises a first portion 13 of substantially circular cross-section and a second portion 15, also of substantially circular cross-section but having a smaller diameter than that of first portion 13. Second portion 15 is located at one end of tool 10 and is offset with respect to the first portion 13 of tool 10.

Tool 10 also comprises a third portion 14 which is positioned substantially at a right angle to portion 13. Portion 14 has on its outermost end a curved tab 11 having suitable means for fastening portion 14 to support bracket 40 (FIG. 1). For example, an aperture 12 in tab 11 may be aligned with a threaded aperture 42 of support bracket 40 and secured with a bolt (not shown).

Tool 10 has suitable indicia or detents 16 at intervals corresponding exactly to the distances between PWA's 25 to assist in locating a particular PWA 25 for insertion or extraction, as will be shown below regarding the operation of the preferred embodiment.

FIG. 3 shows a top sectional view of the PWA card cage 1, taken along line 3—3 of FIG. 1, as well as the insertion/extraction tool 10. As is seen from FIG. 3, each PWA 25 comprises a suitable connector 82 positioned on an edge opposite to the edge of the PWA to which the PWA fascia 20 is affixed. Connector 82 comprises a plurality of conductive pins 84 which mate with appropriate sockets in corresponding connector 86 located on the back-plane or motherboard 80 when PWA 25 is fully inserted into card cage 1. Suitable means (not shown) such as card guides may be employed to ensure that the connector 82 of PWA 25 is properly aligned with connector 86 of back-plane 80.

The operation of the PWA insertion/extraction tool will now be described with reference to FIGS. 1 and 3. When it is desired to insert a PWA 25 into card cage 1, PWA 25 is inserted partially into the card cage aperture 2 by hand until slight contact is made between the connector 82 at the rear of PWA 25 and connector 86 on back-plane 80. Next insertion/extraction tool 10 is suitably rotated about its axis so that the end of tool 10 may pass through aperture 45 in support bracket 40. Without further rotation, tool 10 is then pushed through the apertures 5 of the tabs 50 on the PWA's 25 which are positioned between the support bracket 40 and the PWA 25 being inserted.

Then tool 10 is rotated slightly clockwise about its axis and pushed in slightly, so that only portion 15 of tool 10 is inserted into the tab aperture 5 of the PWA 25 being inserted. Finally, portion 14 of tool 10 is depressed so that portion 15 is rotated in the direction of insertion. Portion 15 is thus forced against the rear side of aperture 5 of the PWA being inserted, thereby forcing the PWA 25 into card cage 1 by inserting the pins 84 of PWA connector 82 into the corresponding sockets of connector 86.

When it is desired to extract a PWA 25, the above-described process is reversed. In order, for example, to extract the fourth PWA 25 from the left side of card cage 1 (see FIG. 1), the tool 10 is inserted through support bracket 40 and successive tab apertures 5 until the fourth indicia or detent 16 from the right on tool 10 is aligned with the aperture 45 of member 44 of support bracket 40. This will properly align tool 10 such that only portion 15 of tool 10 will be positioned within aperture 5 of the fourth PWA 25 from the left side of card cage 1. Then if portion 14 of tool 10 is pulled up, portion 15 is rotated outwardly against aperture 5 of the PWA 25 being extracted, thereby forcing the connector 82 of PWA 25 out of its corresponding back-plane connector 86, so that PWA 25 can be easily withdrawn the rest of the way from the card cage 1 by hand.

To retain the PWA's in the card cage 1, tool 10 is fully inserted through all of the apertures 5 of the PWA's 25 and finally it is rotated appropriately so that portion 15 passes through aperture 63 of the retaining bracket 60 at the opposite end of the card cage aperture 2. When portion 15 of tool 10 has completely passed through aperture 63 of retaining bracket 60, portion 14 of tool 10 is rotated down until tab 11 contacts support bracket 40, and the hole 12 in tab 11 is aligned with a threaded hole 42 in the support bracket 40. Tab 11 may be secured to support bracket 40 by inserting a bolt (not shown) through hole 12 into hole 42 in the support bracket 40.

It will be apparent to those skilled in the art that the disclosed PWA insertion/extraction tool may be modified in numerous ways and may assume many embodiments other than the preferred form specifically set out and described above.

For example, the positions of the support bracket 40 and the retaining bracket 60 may be reversed in order to provide access by tool 10 from the other side of the card cage, in the event that access from the side shown in FIG. 1 is not possible. Also, it will be apparent that the shape of the apertures 5, 45, and 63 may be appropriately selected to match any desired asymmetrical cross-section of he end portion of tool 10.

Accordingly, it is intended by the appended claims to cover all modifications of the invention which fall within the true spirit and scope of the invention.

What is claimed is:

1. A printed wiring assembly card cage comprising:
   a housing having at least one surface with an aperture therein;
   a plurality of printed wiring assembly cards, said cards being adapted to fit into said housing aperture in a side-by-side arrangement, each of said cards having affixed to one edge thereof a tab centrally located between the ends thereof, each tab containing an asymmetrically-shaped aperture therein;
   a support member positioned substantially at a right angle to said housing surface, said support member containing an aperture substantially identical to those of said tabs, said plurality of cards having said tab apertures aligned with said support member aperture when said plurality of cards are fully inserted in said housing; and
   an insertion/extraction member having an end portion thereof of asymmetrically-shaped cross-section corresponding to said tab apertures;
   whereby by selection of a suitable position of rotation of said insertion/extraction member about its axis, said insertion/extraction member may be inserted through said support member aperture and through at least one of said tab apertures, and then by rotating said insertion/extraction member in the appropriate direction about its axis said end portion thereof may be suitably engaged with said tab aperture of a selected one of said cards to insert said card into said housing or to extract said card from said housing.

2. The printed wiring assembly card cage as recited in claim 1, wherein said tab apertures and said support member aperture are key-hole shaped, said apertures being formed from a first circular hole and a second circular hole of smaller diameter offset from the center of said first hole, and wherein said insertion/extraction member has on said end portion thereof a first portion thereof having a cross-section adapted to fit within said first circular hole and a second portion thereof having a cross-section adapted to fit within said second circular hole, said second portion being offset with respect to said first portion to the same degree as said second hole is offset with respect to said first hole; whereby by rotating said insertion/extraction member in the appropriate direction about its axis said second portion thereof may be suitably engaged with said second circular hole of a selected one of said cards to insert said card into said housing or extract said card from said housing.

3. The printed wiring assembly card cage as recited in claim 2, wherein each of said key-hole shaped apertures is oriented such that a line drawn between the centers of said first and second circular holes is parallel to said housing surface.

4. The printed wiring assembly card cage as recited in claim 1, wherein said insertion/extraction member comprises a third portion formed on the end thereof opposite to said second portion, said third portion being positioned substantially at a right angle to said first and second portions.

5. The printed wiring assembly card cage as recited in claim 4, wherein said insertion/extraction member comprises means for securing it to said housing.

6. The printed wiring assembly card cage as recited in claim 1, wherein said cards comprise means for securing them to said housing.

7. The printed wiring assembly card cage as recited in claim 1, further comprising a retaining member positioned substantially at a right angle to said housing, said retaining member having an aperture substantially identical to that of said support member but having an orientation which is rotated with respect to that of said support member aperture, whereby by rotating said insertion/extraction member the end portion thereof can be retained in said retaining member aperture.

8. The printed wiring assembly card cage as recited in claim 7, wherein said insertion/extraction member has indicia thereon identifying the location of each of said plurality of cards when said insertion/extraction member is in its locked position.

* * * * *